United States Patent [19]

Kaltenecker

[11] Patent Number: 5,781,072
[45] Date of Patent: Jul. 14, 1998

[54] DUAL PUSH-PULL AMPLIFIER CIRCUIT AND METHOD

[75] Inventor: Robert S. Kaltenecker, Mesa, Ariz.

[73] Assignee: Motorola, Inc., Schaumburg, Ill.

[21] Appl. No.: 717,026

[22] Filed: Sep. 20, 1996

[51] Int. Cl.$^6$ ........................................................ H03F 3/26
[52] U.S. Cl. ........................... 330/271; 330/275; 330/276
[58] Field of Search .............................. 330/84, 120, 122, 330/124 R, 271, 275, 276, 295, 311

[56] References Cited

U.S. PATENT DOCUMENTS

| | | | |
|---|---|---|---|
| 4,701,716 | 10/1987 | Poole | 330/43 |
| 5,047,732 | 9/1991 | Tanaami et al. | 330/295 |
| 5,066,925 | 11/1991 | Freitag | 330/295 X |
| 5,420,537 | 5/1995 | Weedon et al. | 330/295 X |

OTHER PUBLICATIONS

Kantner, "Transistorized Audio Amplifier" IBM Technical Disclosure Bulletin, vol. 3, No. 1, p. 33, Jun. 1960.

*Primary Examiner*—James B. Mullins
*Attorney, Agent, or Firm*—Rennie William Dover

[57] ABSTRACT

An amplifier circuit (30) has the capability for driving a large number of loads while still maintaining the desirable gain response. The amplifier circuit (30) includes two push-pull amplifier circuits (31 and 41). A first push-pull amplifier circuit (31) has a pair of bipolar transistors (33 and 34) connected in a cascode circuit configuration and a second pair of bipolar transistors (35 and 36) connected in a cascode circuit configuration. In addition, the second push-pull amplifier circuit (41) has a first pair of bipolar transistors (43 and 44) connected in a cascode circuit configuration and a second pair of bipolar transistors (45 and 46) connected in a cascode circuit configuration. The channel distortion and gain response of the amplifier circuit (30) are significantly improved by the push-pull amplifier circuits (31 and 41).

20 Claims, 2 Drawing Sheets

10

30

5,781,072

DUAL PUSH-PULL AMPLIFIER CIRCUIT AND METHOD

BACKGROUND OF THE INVENTION

The present invention relates, in general, to amplifiers and, more particularly, to integrated circuit amplifiers.

Amplifiers used in wideband applications are designed to meet a variety of performance criteria such as gain response, return loss, third order distortion, second order distortion, stability requirements, etc. Further, it is often desirable to generate a signal at a power level higher than can be achieved using a single device. This is typically accomplished by connecting additional single devices in a parallel configuration. Although coupling the devices in a parallel fashion meets the desired output power requirements, other performance criteria, e.g., gain response, are degraded.

Accordingly, it would be advantageous to have an amplifier circuit capable of generating higher power levels without degrading the gain response and stability, and without increasing distortion.

DETAILED DESCRIPTION OF THE DRAWINGS

Figure 1:
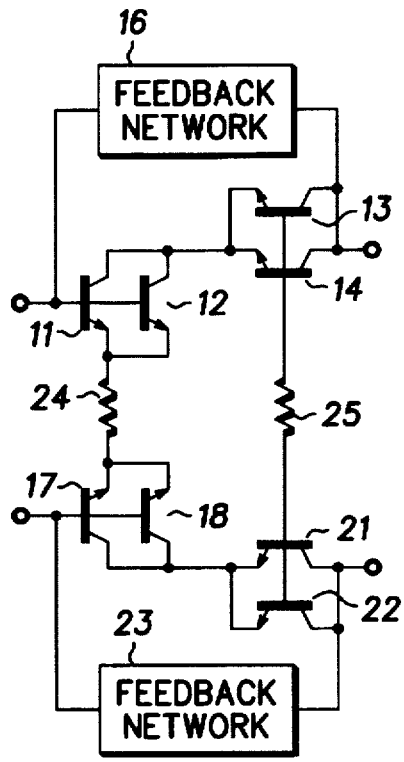
FIG. 1 is a schematic diagram of a prior art amplifier.

FIG. 1 is a schematic diagram of a prior art amplifier circuit 10 typically used in high power wideband applications. Amplifier circuit 10 includes a pair of bipolar transistors 11 and 12 having commonly connected bases which serve as an input terminal of amplifier circuit 10. In addition, the collectors of transistors 11 and 12 are commonly connected and the emitters of transistors 11 and 12 are commonly connected. Accordingly, transistors 11 and 12 are said to be connected in parallel. Amplifier circuit 10 includes another pair of parallel connected bipolar transistors wherein the emitters of transistors 13 and 14 are connected to the collectors of transistors 11 and 12 and the collectors of transistors 13 and 14 are commonly connected and serve as an output terminal of amplifier circuit 10. The collector terminals of transistors 13 and 14 are coupled to the base terminals of transistors 11 and 12 through a feedback network 16.

Transistors are three terminal devices having a collector, a base, and an emitter, respectively corresponding to a first current carrying electrode, a control electrode, and a second current carrying electrode.

Amplifier circuit 10 includes two additional pairs of parallel connected bipolar transistors, i.e., transistors 17 and 18 and transistors 21 and 22. The bases of parallel connected transistors 17 and 18 are commonly connected and serve as another input terminal of amplifier circuit 10, whereas the collectors of parallel connected transistors 21 and 22 are commonly connected and serve as another output terminal of amplifier circuit 10. The commonly connected emitters of transistors 21 and 22 are connected to the commonly connected collectors of transistors 17 and 18. The commonly connected emitters of transistors 11 and 12 are coupled to the commonly connected emitters of parallel connected transistors 17 and 18 by a resistor 24. The commonly connected bases of transistors 13 and 14 are coupled to the commonly connected bases of parallel connected transistors 21 and 22 through resistor 25. The collector terminals of transistors 21 and 22 are coupled to the base terminals of transistors 17 and 18 through a feedback network 23.

Figure 2:
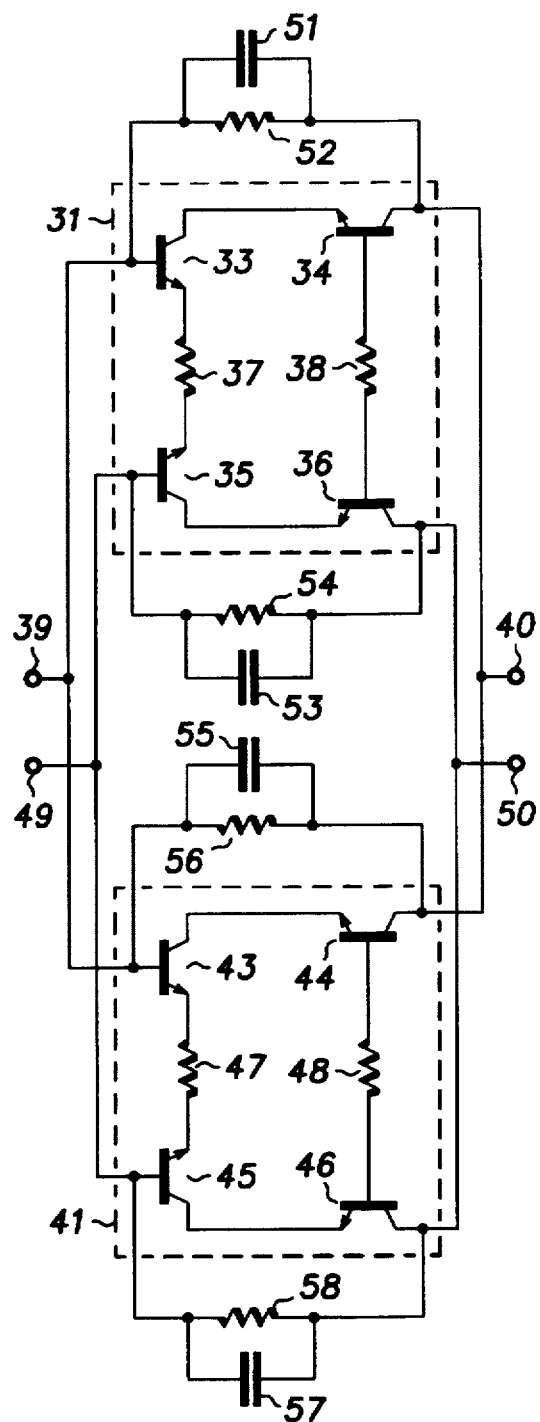
FIG. 2 is a schematic diagram of an amplifier circuit in accordance with the present invention.

FIG. 2 is a schematic diagram of an improved wideband amplifier circuit 30 in accordance with an embodiment of the present invention. Amplifier circuit 30 is comprised of a push-pull amplifier circuit 31, a push-pull amplifier circuit 41, and a plurality of resistor-capacitor feedback networks. Push-pull amplifier circuit 31 includes a pair of bipolar transistors 33 and 34 connected as a cascode configured circuit and a second pair of bipolar transistors 35 and 36 connected as a cascode configured circuit. More particularly, a base of transistor 33 is connected to an input terminal 39 of amplifier circuit 30, a collector of transistor 33 is connected to an emitter of transistor 34, and a collector of transistor 34 is connected to an output terminal 40. Likewise, a base of transistor 35 is connected to an input terminal 49, a collector of transistor 35 is connected to an emitter of transistor 36, and a collector of transistor 36 is connected to an output terminal 50. The emitter of transistor 33 is coupled to the emitter of transistor 35 through a resistor 37 and the base of transistor 34 is coupled to the base of transistor 36 through a resistor 38. Resistor 37 provides series feedback for amplifier circuit 30. It should be noted that transistors 33 and 34 and transistors 35 and 36 are referred to as being in a cascode configuration because the emitters of transistors 34 and 36 are coupled to the collectors of transistors 33 and 35, respectively, and virtual grounds exist at resistors 37 and 38 due to the push-pull nature of push-pull amplifier circuit 31. Capacitor 51 is connected in parallel with a resistor 52 to form a resistor-capacitor network having two terminals, wherein one terminal is connected to the base of transistor 33 and the other terminal is connected to the collector of transistor 34. Similarly, capacitor 53 is coupled in parallel with a resistor 54 to form another feedback network having two terminals wherein one terminal of this feedback network is connected to the base of transistor 35 and the other terminal is connected to the collector of transistor 36.

Push-pull amplifier circuit 41 includes a pair of bipolar transistors 43 and 44 connected as a cascode configured circuit and another pair of bipolar transistors 45 and 46 connected as a cascode configured circuit. More particularly, a base of transistor 43 is connected to input terminal 39 of amplifier circuit 30, a collector of transistor 43 is connected to an emitter of transistor 44, and a collector of transistor 44 is connected to output terminal 40. Likewise, a base of transistor 45 is connected to input terminal 49, a collector of transistor 45 is connected to an emitter of transistor 46, and a collector of transistor 46 is connected to output terminal 50. The emitter of transistor 43 is coupled to the emitter of transistor 45 through a resistor 47 and the base of transistor 44 is coupled to the base of transistor 46 through a resistor 48. Resistor 47 provides series feedback for amplifier circuit 30. It should be noted that transistors 43 and 44 and transistors 45 and 46 are referred to as being in a cascode configuration because the emitters of transistors 44 and 46 are coupled to the collectors of transistors 43 and 45, respectively, and virtual grounds exist at resistors 47 and 48 due to the push-pull nature of push-pull amplifier circuit 41. Capacitor 55 is connected in parallel with a resistor 56 to form a feedback network having two terminals, wherein one terminal is connected to the base of transistor 43 and the other terminal is connected to the collector of transistor 44.

Similarly, capacitor 57 is coupled in parallel with a resistor 58 to form another feedback network having two terminals wherein one terminal of this feedback network is connected to the base of transistor 45 and the other terminal is connected to the collector of transistor 46.

In operation, a voltage signal is applied to input terminal 39 and simultaneously a voltage signal is applied to terminal 49 which has a 180 degree phase difference with respect to the voltage signal applied to input terminal 39. The voltage signal appearing at input terminal 39 is transmitted to the bases of transistors 33 and 43 and is amplified by push-pull amplifier circuits 31 and 41, wherein an amplified signal appears at the collectors of transistors 34 and 44. The amplified output signal appearing at the collectors of transistors 34 and 44 are summed and appear at output terminal 40. Similarly, the voltage signal appearing at input terminal 49 is transmitted to the bases of transistors 35 and 45 and is amplified by push-pull amplifier circuits 31 and 41 and appears at the collectors of transistors 36 and 46. The amplified voltages appearing at the collectors of transistors 36 and 46 are summed and appear at output terminal 50. It should be noted that the output signals appearing at output terminals 40 and 50 are approximately 180° out of phase with respect to each other.

Preferably, the propagation time of the voltage signal from input terminal 39 to the base of transistor 33 is substantially identical to the propagation time of the voltage signal from input terminal 39 to the base of transistor 43. Similarly, the propagation time of the voltage signal from the collector of transistor 34 to output terminal 40 and the propagation time of the voltage signal from the collector of transistor 44 to output terminal 40 are substantially equal. Moreover, the propagation time of the voltage signal from input terminal 49 to the base of transistor 35 is preferably equal to the propagation time of the voltage signal from input terminal 49 to the base of transistor 45, and the propagation time of the voltage signal from the collector of transistor 36 to output terminal 50 is preferably equal to the propagation time of the voltage signal from the collector of transistor 46 to output terminal 50.

In addition, it is desirable for the propagation time of the voltage signal from input terminal 39 to the bases of transistor 33 and 43 to be substantially equal to the propagation time of the voltage signal from input terminal 49 to the bases of transistors 35 and 45. It is also desirable for the transmission time of the current signal from the collectors of transistors 34 and 44 to output terminal 40 to be substantially equal to the transmission time of the current signal from the collectors of transistors 36 and 46 to output terminal 50.

Figure 3:
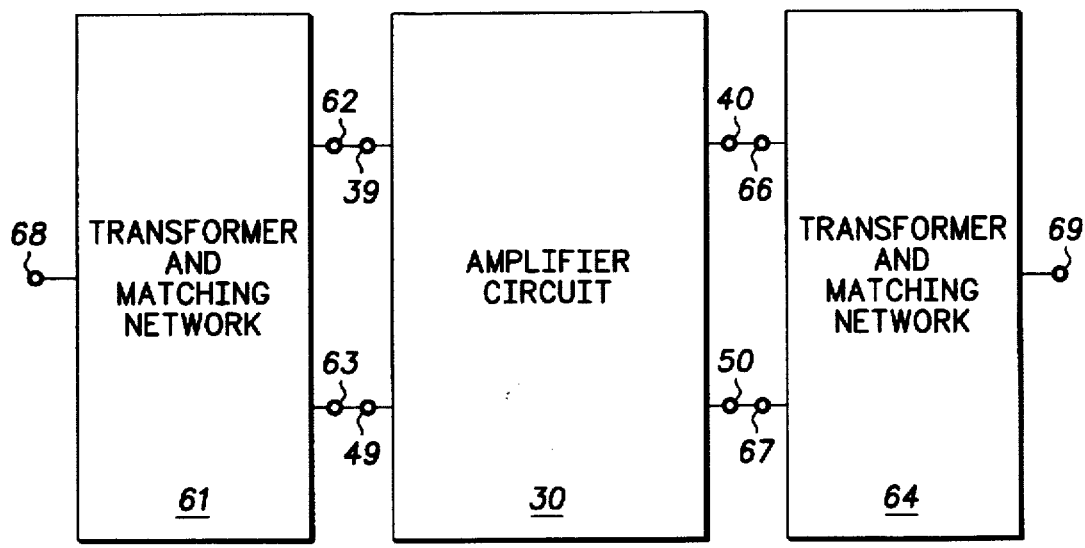
FIG. 3 is a block diagram of a hybrid amplifier module having the amplifier circuit of FIG. 2.

Now referring to FIG. 3, a block diagram of a hybrid amplifier module having the amplifier circuit of the present invention included therein is illustrated. More particularly, input terminal 39 of amplifier circuit 30 is connected to an output terminal 62 of an input transformer-and-matching network 61. An input terminal 49 of amplifier circuit 30 is connected to an output terminal 63 of transformer-and-matching network 61. An output terminal 40 of amplifier circuit 30 is connected to an input terminal 66 of transformer-and-matching network 64 and an output terminal 50 of amplifier circuit 30 is connected to an input terminal 67 of an output transformer-and-matching network 64.

In operation, a single-ended input signal appears at input terminal 68 of hybrid module 60. The input signal is separated into an in-phase portion and an out-of-phase portion wherein the in-phase portion is transmitted to input terminal 39 via output terminal 62 and the out-of-phase portion is transmitted to input terminal 49 via output terminal 63. It should be noted that the signals appearing at input terminals 39 and 49 are 180° out of phase. The input signals appearing at input terminals 39 and 49 are amplified and transmitted to transformer-and-matching network 64 via terminals 66 and 67. Transformer-and-matching network 64 combines or sums the signals appearing at input terminals 66 and 67 to form an output signal which is transmitted through output terminal 69. Thus, transformer and matching network 64 transforms the signals at input terminals 66 and 67 to signals that are in phase with respect to each other, i.e., signals that can be summed together to generate the output signal appearing at output terminal 69. It should be noted that a transformer could be used to transform the signals at input terminals 66 and 67 of transformer and matching network 64 into a single signal that is the sum of both input signals.

Figure 4:
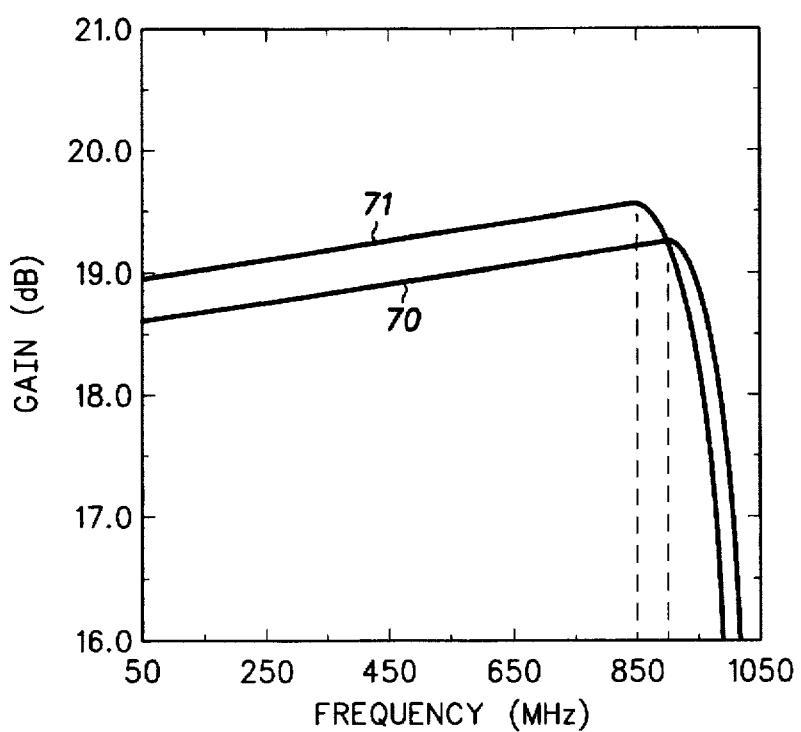
FIG. 4 is an output response comparing the frequency response of the amplifiers of FIGS. 1 and 2.

FIG. 4 illustrates the gain response of a circuit module that has amplifier circuit 30 and the gain response of a hybrid module that includes amplifier circuit 10. In other words, FIG. 4 illustrates one of the improvements provided by the present invention. Gain response curve 70 illustrates the response of the hybrid module which includes amplifier circuit 30 in accordance with the present invention, whereas gain response curve 71 illustrates the gain response of a prior art amplifier circuit used in a hybrid module. The gain of the circuit in accordance with the present invention begins to roll-off at a higher frequency than the gain of a hybrid module using a prior art amplifier circuit.

By now it should be appreciated that an amplifier circuit has been provided that is capable of driving a large number of loads while still maintaining the desirable gain response. For example, the gain is maintained for an additional 50 MHz beyond that of prior art amplifier circuits. Further, the channel distortion for the composite triple B (CTB) and the composite second order (CSO) distortion terms is significantly improved, e.g., 2 decibels (db) and 6 db, respectively.

I claim:

1. An amplifier circuit, comprising:

a first push-pull amplifier circuit having first and second inputs and first and second outputs;

a second push-pull amplifier circuit having first and second inputs and first and second outputs, the first input of the first push-pull amplifier circuit coupled to the first input of the second push-pull amplifier circuit, the second input of the first push-pull amplifier circuit coupled to the second input of the second push-pull amplifier circuit, the first output of the first push-pull amplifier circuit coupled to the first output of the second push-pull amplifier circuit, and the second output of the first push-pull amplifier circuit coupled to the second output of the second push-pull amplifier circuit;

a first feedback network, the first feedback network coupled between the first input and the first output of the first push-pull amplifier circuit;

a second feedback network, the second feedback network coupled between the second input and the second output of the first push-pull amplifier circuit;

a third feedback network, the third feedback network coupled between the first input and the first output of the second push-pull amplifier circuit; and a fourth feedback network, the fourth feedback network coupled between the second input and the second output of the second push-pull amplifier circuit.

2. The amplifier circuit of claim 1, wherein the first push-pull amplifier circuit comprises:
- a first cascode configured circuit having first, second, third, and fourth terminals, wherein the first terminal serves as the first input of the first push-pull amplifier circuit and the second terminal serves as the first output of the first push-pull amplifier circuit; and
- a second cascode configured circuit having first, second, third, and fourth terminals, wherein the first terminal serves as the second input of the first push-pull amplifier circuit and a second terminal serves as the second output of the first push-pull amplifier circuit.

3. The amplifier circuit of claim 2, wherein the third terminal of the first cascode configured circuit is coupled to the third terminal of the second cascode configured circuit.

4. The amplifier circuit of claim 3, wherein the fourth terminal of the first cascode configured circuit is coupled to the fourth terminal of the second cascode configured circuit.

5. The amplifier circuit of claim 4, wherein the third terminal of the first cascode configured circuit is coupled to the third terminal of the second cascode configured circuit via a fifth feedback network and the fourth terminal of the first cascode configured circuit is coupled to the fourth terminal of the second cascode configured circuit via a sixth feedback network.

6. The amplifier circuit of claim 5, wherein the fifth and sixth feedback networks are resistors.

7. The amplifier circuit of claim 2, wherein the fourth terminal of the first cascode configured circuit is coupled to the fourth terminal of the second cascode configured circuit.

8. The amplifier circuit of claim 2, wherein the first cascode configured circuit comprises:
- a first transistor having a control electrode and first and second current carrying electrodes, the control electrode serving as the first terminal of the first cascode configured circuit, and the first current carrying electrode serving as the third terminal of the first cascode configured circuit; and
- a second transistor having a control electrode and first and second current carrying electrodes, the control electrode serving as the fourth terminal of the first cascode configured circuit, the first current carrying electrode coupled to the second current carrying electrode of the first transistor, and the second current carrying electrode serving as the second terminal of the first cascode configured circuit.

9. The amplifier circuit of claim 2, wherein the second cascode configured circuit comprises:
- a first transistor having a control electrode and first and second current carrying electrodes, the control electrode serving as the first terminal of the second cascode configured circuit, and the first current carrying electrode serving as the third terminal of the second cascode configured circuit; and
- a second transistor having a control electrode and first and second current carrying electrodes, the control electrode serving as the fourth terminal of the second cascode configured circuit, the first current carrying electrode coupled to the second current carrying electrode of the first transistor, and the second current carrying electrode serving as the second terminal of the second cascode configured circuit.

10. The amplifier circuit of claim 1, wherein the first, second, third, and fourth feedback networks comprise a resistor-capacitor network.

11. A method for generating first and second output signals, comprising the steps of:
- amplifying a first input signal and a second input signal to form a first amplified input signal and a second amplified input signal, the second input signal having a phase difference with respect to the first input signal;
- amplifying the first input signal and the second input signal to form a third amplified input signal and a fourth amplified input signal;
- summing the first and third amplified input signals to form the first output signal;
- summing the second and fourth amplified input signals to form the second output signal;
- feeding a portion of the first output signal as a first feedback signal to the first input signal; and
- feeding a portion of the second output signal as a second feedback signal to the second input signal.

12. The method of claim 11, wherein the first and second output signals are 180 degrees out of phase with respect to each other.

13. The method of claim 11, further including the step of converting a single-ended input signal to form the first and second input signals.

14. The method of claim 11, further including the steps of:
- transforming the second output signal to form a transformed second output signal, wherein the transformed second output signal is in phase with the first output signal; and
- summing the first output signal and the transformed second output signal.

15. The method of claim 14, wherein the step of transforming the second output signal includes using a transformer to transform the second output signal into the transformed second output signal.

16. A hybrid module having an input signal and an amplified input signal, comprising:
- an input transformer having an input and first and second outputs;
- a first push-pull amplifier circuit having first and second inputs and first and second outputs, wherein the first and second inputs are coupled to the first and second outputs, respectively, of the input transformer;
- a second push-pull amplifier circuit having first and second inputs and first and second outputs, the first input of the first push-pull amplifier circuit coupled to the first input of the second push-pull amplifier circuit, the second input of the first push-pull amplifier circuit coupled to the second input of the second push-pull amplifier circuit, the first output of the first push-pull amplifier circuit coupled to the first output of the second push-pull amplifier circuit, and the second output of the first push-pull amplifier circuit coupled to the second output of the second push-pull amplifier circuit;
- a first feedback network, the first feedback network coupled between the first input and the first output of the first push-pull amplifier circuit;
- a second feedback network, the second feedback network coupled between the second input and the second output of the first push-pull amplifier circuit; and
- an output transformer having first and second inputs and an output providing the amplified input signal, wherein the first input is coupled to the first output of the first push-pull amplifier, and the second input is coupled to the second output of the first push-pull amplifier circuit.

17. The hybrid module of claim 16, wherein the first input of the first push-pull amplifier circuit is 180 degrees out of phase with respect to the second input of the first push-pull amplifier circuit.

18. The hybrid module of claim 17, wherein the the first output of the first push-pull amplifier circuit is 180 degrees out of phase with respect to the second output of the first push-pull amplifier circuit.

19. The hybrid module of claim 16, wherein the first push-pull amplifier circuit comprises first and second cascode configured circuits.

20. The hybrid module of claim 16, wherein the second push-pull amplifier circuit comprises first and second cascode configured circuits.

* * * * *